United States Patent [19]
Anthony

[11] Patent Number: 6,109,677
[45] Date of Patent: Aug. 29, 2000

[54] APPARATUS FOR HANDLING AND TRANSPORTING PLATE LIKE SUBSTRATES

[75] Inventor: Kurt G. Anthony, Tempe, Ariz.

[73] Assignee: Sez North America, Inc., Phoenix, Ariz.

[21] Appl. No.: 09/086,980

[22] Filed: May 28, 1998

[51] Int. Cl.[7] .............................. B65G 49/07; B25J 15/00
[52] U.S. Cl. ................................. 294/103.1; 294/119.1; 414/751; 414/941; 901/39
[58] Field of Search ................... 294/1.1, 32, 34, 294/103.1, 119.1, 902; 414/749, 751, 936, 941; 901/37, 39; 269/152–154

[56] References Cited

U.S. PATENT DOCUMENTS

| | | | |
|---|---|---|---|
| 3,950,024 | 4/1976 | Martin | 294/34 |
| 4,813,732 | 3/1989 | Klem | 294/103.1 |
| 4,892,455 | 1/1990 | Hine | 414/941 |
| 4,971,512 | 11/1990 | Lee et al. | 294/103.1 |
| 5,022,695 | 6/1991 | Ayers | 294/103.1 |
| 5,100,285 | 3/1992 | Wagner | 294/119.1 |
| 5,484,252 | 1/1996 | Mutoh | 414/941 |
| 5,700,046 | 12/1997 | Van Doren et al. | 294/119.1 |
| 5,711,647 | 1/1998 | Slocum | 414/941 |

*Primary Examiner*—Dean J. Kramer
*Attorney, Agent, or Firm*—John F. A. Earley; John F. A. Earley, III; Harding, Earley, Follmer & Frailey

[57] ABSTRACT

An apparatus for handling and transporting plate like substrates comprises a first flat carrier member and a second flat carrier member, the second flat carrier member being arranged at least along one side wall of the first carrier member, the first and second carrier members being arranged horizontally and provided with at least four vertically extending guiding members, arranged at spaced locations to each other in two sets of at least two guiding members each, whereby each carrier member comprises at least one guiding member of each set of guiding members, the first and second carrier member being mounted on a robot and moveable relative to each other in a longitudinal direction.

6 Claims, 3 Drawing Sheets

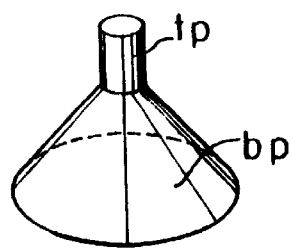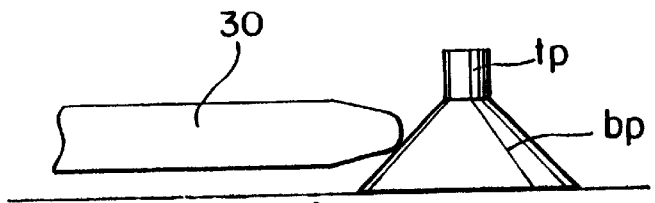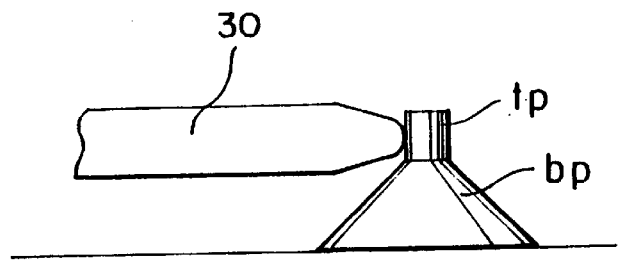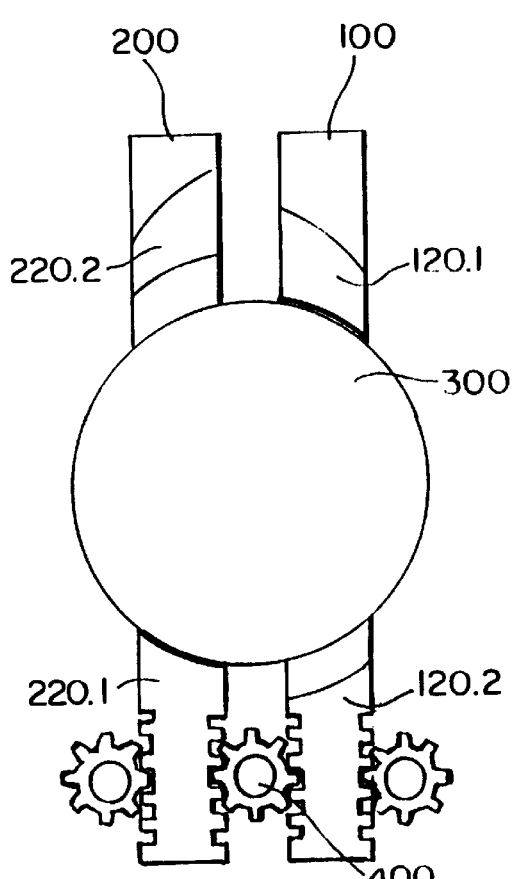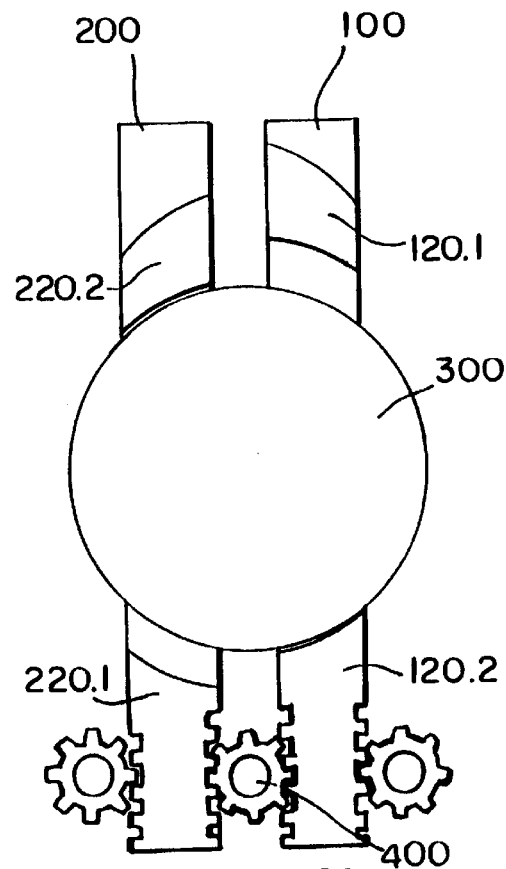

APPARATUS FOR HANDLING AND TRANSPORTING PLATE LIKE SUBSTRATES

TECHNICAL FIELD OF THE INVENTION

The invention relates in general to an apparatus for handling and transporting plate like substrates such as semiconductor wafers. Insofar as the following description refers to wafers this will include any types of plate like substrates, like compact discs etc.

BACKGROUND OF THE INVENTION

In semiconductor fabrication it is desirable to employ automated handling on the semiconductor wafers for efficient processing. Said wafers are typically retrieved from and loaded back into a carrier holding a number of wafers. The space available between adjacent wafers in the carrier is very small.

Insofar any handling apparatus must be constructed with a flat and elongated equipment to be fed in or retracted from said carrier.

At the same time, while the wafers are being moved, the wafers must be held securely, but gently and are not allowed to interfere with adjacent wafers in the cassette (carrier). Any contact with the surfaces of the wafers should be avoided.

U.S. Pat. No. 5,711,646 discloses a substrate transfer apparatus for receiving and delivering a substrate among a plurality of process locations and transferring the substrate among the process locations. Said apparatus comprises one transfer member provided with two support portions, one for supporting the wafer in a first position and second support portions for supporting the wafer in a second position. With this apparatus no exact placement of the wafer within the transfer member may be achieved and a contact between the wafer surface and the transfer member may not be avoided with certainty.

U.S. Pat. No. 4,900,214 provides an apparatus of the kind mentioned above with an elongated arm having a first jaw and a second jaw for corresponding engagement of the edge of a wafer. Insofar the same disadvantages appear as with respect to the apparatus known from U.S. Pat. No. 5,711,646.

An apparatus with piezoelectric grippers is known from EP 0 810 636 A2.

EP 0 778 611 A2 discloses an end effector for a wafer transfer device, comprising a pocket allowing the end effector to contact only the edges of the wafer.

A similar device is described in EP 0 555 890 A2.

Again a wafer pick up device with just one carrier arm is disclosed in U.S. Pat. No. 4,639,028.

The semiconductor slice holder according to U.S. Pat. No. 5,022,695 has three tines, a center tine and two side tines. The side tines are fixed to position, while the center tine is moved in and out using a control field actuator. A Hall effect sensor on the controlled field actuator provides an electrical feedback to provide a firm gripping force with reduce damage to slice edges by sensitive control of the gripping force.

Another apparatus of the kind mentioned above is presented by U.S. Pat. No. 4,813,732, comprising three rod-like projections (called fingers), one finger of which is extendable, while the others are fixed. Button shaped tips located on the ends of each of the fingers serve to engage the wafers edge.

Most of said devices are based on the so called ECO principle (ECO=Edge Contact Only). Said ECO does not entirely prevent contamination issues. These edge contact points also become susceptible to contamination if using the same contact points for handling and transport before and after wafer process steps. Wafers using the same contact points after processing can become re-contaminated thus causing degradation of the semiconductor devices.

OBJECTS OF THE INVENTION

It is therefore an object of the present invention to provide an improved apparatus for handling and transporting of semiconductor wafers.

It is a further object of the invention to provide an apparatus which does not require any contact with the wafer front or back surfaces thus eliminating corresponding contamination issues.

It is yet another object of the invention to provide an apparatus by which any contaminations (for example dust particles) remaining onto said apparatus after a first handling and transport action do not effect handling and re-transport of another wafer.

SUMMARY OF THE INVENTION

The aforementioned and other objects are accomplished, according to the present invention, by an apparatus for handling and transporting of plate like substrates comprising a first flat carrier means and a second flat carrier means, said second flat carrier means being arranged at least along one side wall of the first carrier means, said first and second carrier means being arranged horizontally and provided wit h at least four vertically extending guiding means, arranged at spaced locations to each other in two sets of at least two guiding means each, whereby each carrier means comprises at least one guiding means of each set of guiding means, said first and second carrier means being mounted on a robot and moveable relative to each other in a longitudinal direction.

This apparatus provides two different holding positions for a wafer, each position being characterized by at least two guiding means of an appropriate shape to hold or grip the wafer safely. An embodiment is described in more detail in the description of the drawings.

An alternative version of the invention may be described by an apparatus of the kind mentioned before, but with at least six vertically extending guiding means, arranged at spaced locations to each other in two sets of at least three guiding means each, whereby each set of guiding means comprises at least one guiding means on said first carrier means and at least two guiding means on said second carrier means.

This apparatus provides as well two different holding positions for a wafer, but each holding position being characterized by at least three guiding means, arranged at spaced locations around the periphery of the wafer. At least one of said guiding means extends from said first carrier means and at least two guiding means extend from said second carrier means. By a longitudinal movement of at least one of said carrier means the guiding means may be moved in a position to hold or grip the wafer and vice versa in a position in which the wafer is released.

The carrier means may be of small and oblong shape and—as an example—arranged parallel to each other.

Depending on the shape and placement of the guiding means the wafer is held just by gravity or gripped along its periphery. In the latter case the robot (robot arm) may be provided to turn the apparatus and thereby turn the wafer at any angle wanted.

Because of the two sets of guiding means one set may be used for taking off any wafer from a cassette or the like and the other set may be used for re-transport of another wafer into said cassette. Besides these two positions at least one third position (in between) characterizes the "release" position for the wafers to be treated. During handling and transport the wafer may be treated in any way wanted. For example a layer may be applied to and/or removed from the wafer. Another possibility is to wash or clean one or both surfaces of the wafer or just to transport it from one place to another.

In any case, because of the two sets of guiding means, any danger of re-contamination as described before may be avoided.

Although both carrier means may be moveable it will be sufficient to prepare one fixed carrier means and one moveable carrier means.

Said first carrier means may be shaped plate like and said second carrier means may have a frame like structure surrounding said first carrier means at least along its side walls and its free protruding end wall.

In another embodiment a second carrier means comprises two arms running parallel to said side walls of said first carrier means.

In both embodiments first carrier means may be provided with tongues or grooves along its lateral outer side walls, while said second carrier means being provided with corresponding grooves or tongues along its corresponding inner side walls. By this embodiment the inner first carrier means may be guided with its tongues along the corresponding grooves of the second carrier means in a longitudinal direction in order to bring the guiding means on said moveable arm closer to said guiding means of said fixed arm (to hold or grip the wafer) or the other way round to enlarge the distance between the fixed guiding means and the guiding means on the moveable carrier (in order to release a corresponding wafer).

According to one embodiment the guiding means are shaped frustroconical. Accordingly any wafers are held just by gravity.

In a second embodiment the guiding means have a frustroconical shape with a cylindrical free end. This design enables a gripping contact between the cylindrical free ends and the outer edge of the wafer.

Another design provides guiding means in the form of a segment of a circle with inclined faces opposite corresponding guiding means of the same set. Again these segments may have vertical free ends for gripping the wafer. This shape is mainly advantageous for the first embodiment described with just two guiding means per set.

If each set of guiding means comprises four members (two on each carrier means) the wafer is held at four spaced locations, two of which (fixed onto the inner carrier means) being closer together than the other two fixed on the outer carrier means.

The height of the guiding means is limited according to the space within a cassette or the like between two adjacent floors. This is true mostly for the guiding means provided at the free ends of the carrier means, entering the space between adjacent wafers.

The placement of the wafers within the handling and transport apparatus may be improved by gas channels, provided within at least one of said carrier means and extending (running out) in its top surface for blowing a gas like cleaned air or an inert gas such a nitrogen upwardly in a vertical direction, i.e. into the space below the bottom surface of the wafer to be treated. Correspondingly an air cushion is developed from the interaction of air passing through air holes at the ends of the channels and the flat surface of the wafer. In this embodiment the wafer does not touch the end effector according to the present invention.

Additional objects and advantages of the invention will be set force in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings illustrate embodiments of the invention and, together with the description, serve to explain the principals of the invention.

FIG. 3 is a perspective view of one embodiment of a guiding means

FIG. 4 is a sectional view of a wafer in a holding position onto one guiding means FIG. 5 is a sectional view of a wafer in a gripping position onto one guiding means FIG. 6 is a top view showing a wafer in an apparatus of a different embodiment in a first holding position.

FIG. 7 is a top view showing a wafer in a second holding position.

DETAILED DESCRIPTION OF THE DRAWINGS

Figure 1:
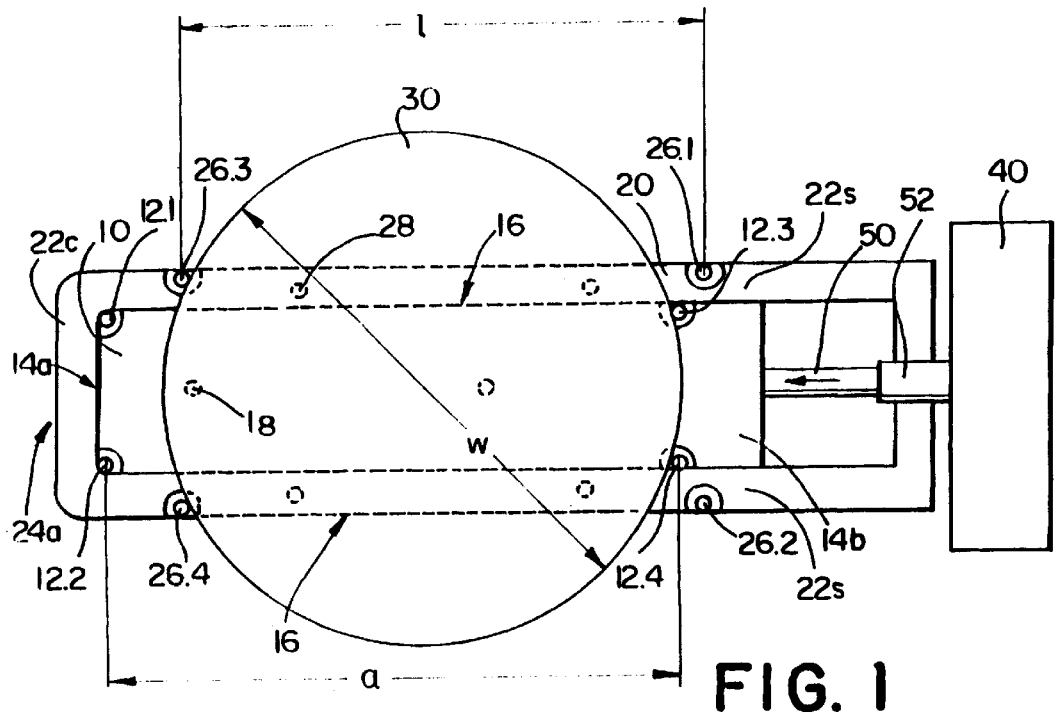
FIG. 1 is a top view showing a wafer in a first holding position (A)

FIG. 1 is a partial top view on an apparatus for handling and transporting a wafer.

It comprises a plate like first carrier 10 of rectangular shape. Carrier 10 is equipped with four guiding pins 12.1, 12.2, 12.3 and 12.4. Guiding pins 12.1 and 12.2 are arranged close to the corner regions at a free end 14a and guiding pins 12.3 and 12.4 are arranged opposite to each other at a distance a from said guiding pins 12.1, 12.2 close to side walls 16 of said carrier 10.

Distance a is a bit larger than diameter w of a wafer 30 to be handled, although this feature is of course not imperative.

At its opposite end 14b carrier 10 is coupled to a robot 40 via a telescope arm 50.

Carrier 10 is about two millimeters thick and contains gas channels (not shown), coupled at one end to a gas supply line (not shown) and running out at their other end in holes 18 in a top surface of carrier 10.

A second carrier 20 is—in its top view—U-shaped and presents as well a thickness of about two millimeters. It comprises two side arms 22s, running parallel to the side walls 16 of carrier 10 and a connecting arm 22c at its free end 24a.

Four guiding pins 26.1, 26.2, 26.3 and 26.4 extend perpendicular from a top surface of carrier 20.

Guiding pins 26.3 and 26.4 are arranged relatively close to the free end 24a while guiding pins 26.1 and 26.2 are placed at a distance b from said pins 26.3, 26.4. In this embodiment distance b is smaller than distance a.

Carrier 20 is fixedly secured to a "static" part 52 of said telescope arm 50.

All guiding pins are shaped according to FIG. 3, i.e. with a frustroconical basic part bp and a cylindrical top part tp.

Figure 2:
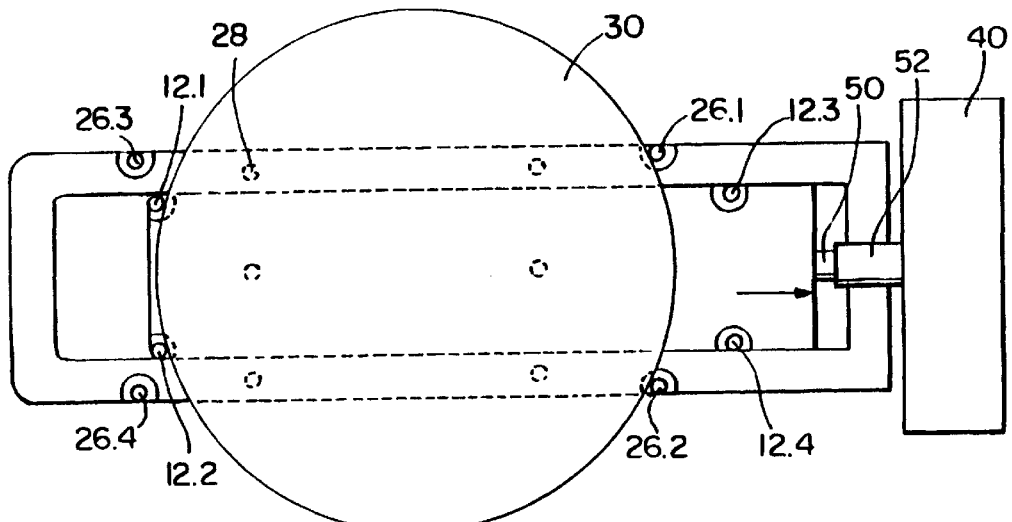
FIG. 2 is top view on a wafer in a second holding position (B)

As explained with respect to carrier 10 corresponding gas channels are provided in carrier 20 and corresponding outlet openings 28 are shown in FIGS. 1,2.

According to the invention pins 12.1, 12.2; 26.1, 26.2 belong to a first set while pins 12.3, 12.4; 26.3, 26.4 belong to a second set.

OPERATION OF THE APPARATUS

The operation of the apparatus according to the present invention can be understood in the following manner.

For loading a wafer from a cassette said carrier 10 is put in a position according to which its free end 14a is placed at a distance to the free end 24a of carrier 20.

By activation of robot 40 carriers 10, 20 are then positioned between two adjacent wafers in a wafer cassette (not shown). The assembly is moved so that it enters the space between two adjacent wafers. Of course the end effector assembly does not touch the surfaces of either wafer during this step.

Thereafter the assembly is lifted a bit (1–2 mm) and correspondingly the outer edge of wafer 30 gently gets in contact with inclined surfaces (basic parts bp) of guiding pins 12.3, 12.4; 26.3, 26.4 (second set of pins) as shown in FIG. 4.

Thereafter the moveable carrier 10 is transferred by telescope arm 50 in a position shown in FIG. 1 (to the left) according to which the outer edge of wafer 30 gets in contact with the cylindrical surfaces of the upper parts (tp) of guiding members 12.3, 12.4; 26.3, 26.4, which now define a gripping position A.

In order to delimit the contact points between wafer 30 and guiding pins 12.3, 12.4; 26.3, 26.4 a gas like nitrogen may be fed via holes 18, 28 into the space between the top surface of carrier 10 and the bottom surface of wafer 30, thereby forming an air cushion, onto which wafer 30 is hold in place without any contact areas because of the so called Bernoulli effect. Details insofar may be taken from U.S. Pat. No. 4,002,254.

Thereafter the wafer is taken off the cassette by activating robot 40 and transported to a different place.

FIG. 5 shows a wafer 30 being in contact at its outer edge with the top part (tp) of a guiding pin. Obviously wafer 30 is correspondingly gripped by the other three guiding pins of the corresponding set. In this particular position the assembly may be turned at any angle after taken off the corresponding cassette and for this purpose part 52 of telescope arm 50 is arranged rotatably.

FIG. 2 shows the assembly in a position for transporting a fresh wafer 30 into a cassette.

According to FIG. 2 wafer 30 is held in position by guiding pins 12.1, 12,2; 26.1, 26.2 (second set) in the same way as disclosed according to the assembly position of FIG. 1.

To reach the holding position according FIG. 2 the assembly has been placed before below the corresponding wafer 30 with a position of carrier 10 slightly more left than in FIG. 2.

Thereafter the assembly was moved upwardly and then carrier 10 was retracted (moved to the right) to the position shown.

Compared with FIG. 1 it becomes clear that the two sets of guiding pins 12.1, 12.2; 26.1, 26.2 and 12.3, 12.4; 26.3, 26.4 respectively serve to provide two independent holding positions for different wafers 30. Insofar different contact points may be used for example for loading and unloading of a wafer and by this means any contaminations at one or more guiding pins of one set do not effect handling and transport of another wafer 30 with the other set of guiding pins.

Figure 8:
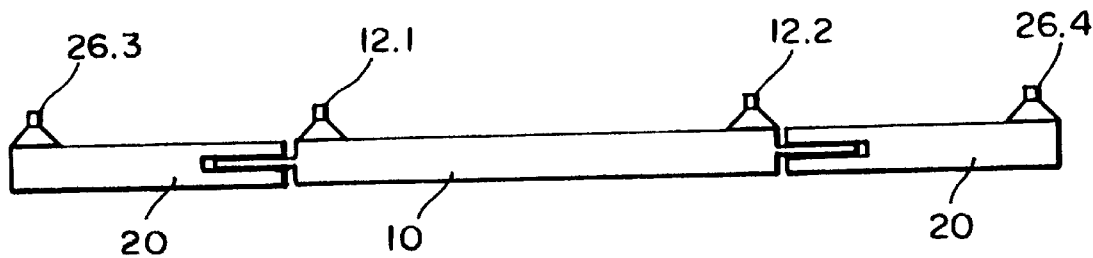
FIG. 8 is a view in cross-section showing an optional tongue and groove arrangement for guiding a first carrier 10 along a second carrier 20.

Carrier 10 may be provided with tongues or grooves along its lateral outer side walls, and carrier 20 may be provided with corresponding grooves or tongues along its corresponding inner side walls. This optional feature is illustrated in FIG. 8, with carrier 10 being guided with its tongues along the corresponding grooves of carrier 20.

Figure 9:
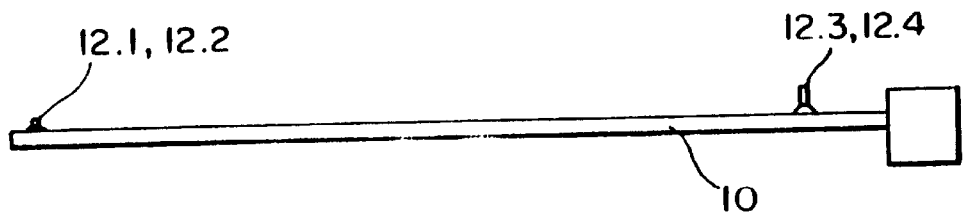
FIG. 9 is a view in side elevation illustrating guiding pins positioned near the free end of the inventive apparatus being shorter in height than the guiding pins positioned closer to an activating robot, in accordance with one embodiment of the invention.

The guiding pins positioned near the free end of the apparatus may be shorter in height than the guiding pins positioned closer to the robot 40, as illustrated in FIG. 9.

FIG. 6 and 7 describe another version of an apparatus, comprising a first carrier 100 of flat, small and long shape, running parallel to a second carrier 200 of approximately same shape.

Each carrier 100 and 200 respectively are equipped with two guiding wings 120.1, 120.2 and 220.1, 220.2 respectively wherein wings 120.1, 220.1 belong to a first functional set while wings 120.2 and 220.2 create a second functional set of guiding means.

Each wing is designed as a segment of a circle on its face facing the corresponding wing, so that the two wings 120.1, 220.1 of one set may hold and/or grip a wafer 300 in a first position (FIG. 6) and the other two wings 120.2, 220.2 of the second set are arranged as to hold or grip the wafer 300 in a separate second position (FIG. 7).

Here, both carriers 100, 200 are moveable in a longitudinal direction (via corresponding tooth shaped side walls and corresponding tooth shaped wheels) to transfer the apparatus in the holding position wanted.

Again carriers 100, 200 are linked to a robot 400.

Additional advantages and modifications will readily occur to those skilled in the art. Therefore the invention in its broader aspects is not limited to the specific details and representative devices shown and described herein. Accordingly various modifications may be made without departing from the spirit or scope of the general inventive concept as defined by the amended claims and their equivalents.

For example the shape of the carrier is not limited to the shape as disclosed in the figures. As an example carrier 20 may be divided in two parts, each similar to side arms 22s.

Correspondingly carrier 10 may be divided into two arms, each being provided with two guiding pins (12.1, 12.3 and 12.2, 12.4 respectively).

Another modification may provide a carrier 10 much smaller than that shown in FIGS. 1, 2, running in the middle between side arms 22s of carrier 20 and provided only with two guiding pins, one of each belonging to one set of guiding pins.

What is claimed is:

1. An apparatus for handling and transporting plate like substrates comprising a first flat carrier means and a second flat carrier means, said second flat carrier means being arranged at least along one side wall of the first carrier means, said first and second carrier means being arranged horizontally and provided with at least four vertically extending guiding means, arranged at spaced locations to each other in two sets of at least two guiding means each, whereby each carrier means comprises at least one guiding means of each set of guiding means, said first and second carrier means being mounted on a robot and moveable relative to each other in a longitudinal direction, wherein said second or first carrier means is attached to the robot via a telescopic arm.

2. An apparatus for handling and transporting plate like substrates comprising a first flat carrier means and a second flat carrier means, said second flat carrier means being arranged at least along one side wall of the first carrier means, said first and second carrier means being arranged horizontally and provided with at least four vertically extending guiding means, arranged at spaced locations to each other in two sets of at least two guiding means each, whereby each carrier means comprises at least one guiding means of each set of guiding means, said first and second carrier means being mounted on a robot and moveable relative to each other in a longitudinal direction, wherein said first carrier means has a plate like shape and said second carrier means has a frame like shape surrounding said first carrier means at least along its side walls and its free protruding end.

3. An apparatus for handling and transporting plate like substrates comprising a first flat carrier means and a second flat carrier means, said second flat carrier means being arranged at least along one side wall of the first carrier means, said first and second carrier means being arranged horizontally and provided with at least four vertically extending guiding means, arranged at spaced locations to each other in two sets of at least two guiding means each, whereby each carrier means comprises at least one guiding means of each set of guiding means, said first and second carrier means being mounted on a robot and moveable relative to each other in a longitudinal direction, wherein said first carrier means is provided with tongues or grooves along its lateral outer side walls and said second carrier means is provided with corresponding grooves or tongues along its corresponding inner side walls.

4. An apparatus for handling and transporting plate like substrates comprising a first flat carrier means and a second flat carrier means, said second flat carrier means being arranged at least along one side wall of the first carrier means, said first and second carrier means being arranged horizontally and provided with at least four vertically extending guiding means, arranged at spaced locations to each other in two sets of at least two guiding means each, whereby each carrier means comprises at least one guiding means of each set of guiding means, said first and second carrier means being mounted on a robot and moveable relative to each other in a longitudinal direction, wherein said guiding means are designed as a segment of a circle with inclined faces opposite corresponding guiding means of the same set.

5. An apparatus for handling and transporting plate like substrates comprising a first flat carrier means and a second flat carrier means, said second flat carrier means being arranged at least along one side wall of the first carrier means, said first and second carrier means being arranged horizontally and provided with at least four vertically extending guiding means, arranged at spaced locations to each other in two sets of at least two guiding means each, whereby each carrier means comprises at least one guiding means of each set of guiding means, said first and second carrier means being mounted on a robot and moveable relative to each other in a longitudinal direction, wherein at least one of said carrier means is provided with gas channels, extending in its top surface for blowing a gas upwardly in a vertical direction.

6. An apparatus for handling and transporting plate like substrates comprising a first flat carrier means and a second flat carrier means, said second flat carrier means being arranged at least along one side wall of the first carrier means, said first and second carrier means being arranged horizontally and provided with at least four vertically extending guiding means, arranged at spaced locations to each other in two sets of at least two guiding means each, whereby each carrier means comprises at least one guiding means of each set of guiding means, said first and second carrier means being mounted on a robot and moveable relative to each other in a longitudinal direction, wherein the guiding means close to the free end of the carrier means are of smaller height than the guiding means close to the robot.

* * * * *